United States Patent [19]

Prince

[11] Patent Number: 4,811,687
[45] Date of Patent: Mar. 14, 1989

[54] TEMPERATURE CONTROL APPARATUS FOR THIN FILM DEPOSITION SYSTEM

[75] Inventor: Eric T. Prince, Fairport, N.Y.

[73] Assignee: Eastman Kodak Company, Rochester, N.Y.

[21] Appl. No.: 133,113

[22] Filed: Dec. 14, 1987

[51] Int. Cl.$^4$ .............................................. C23C 14/00
[52] U.S. Cl. .................................... 118/666; 118/725; 118/730; 204/298
[58] Field of Search ...................... 118/725, 730, 666; 204/298

[56] References Cited

U.S. PATENT DOCUMENTS

| | | | |
|---|---|---|---|
| 4,100,879 | 7/1978 | Goldin | 118/730 |
| 4,171,235 | 10/1979 | Fraas | 118/730 |
| 4,226,208 | 10/1980 | Nishida | 118/730 |
| 4,632,058 | 12/1986 | Dixon | 118/730 |

Primary Examiner—Richard Bueker
Attorney, Agent, or Firm—Warren W. Kurz

[57] ABSTRACT

Apparatus adapted for use in high vacuum, thin-film deposition system for controlling the temperature of moving substrate holder. Preferably, such temperature control apparatus comprises a fixed, temperature-controlled, thermally conductive member, and liquid heat transfer medium (preferably liquid gallium) for thermally coupling such member to the substrate holder as it moves through a vacuum chamber.

10 Claims, 2 Drawing Sheets divide# TEMPERATURE CONTROL APPARATUS FOR THIN FILM DEPOSITION SYSTEM

BACKGROUND OF THE INVENTION

This invention relates to improvements in high vacuum, thin-film deposition systems, e.g. sputtering systems. More particularly, it addresses the technical problem of accurately controlling the temperature of a moving substrate holder which tends to overheat during the deposition process.

In high vacuum systems for depositing thin films of certain materials (e.g. metals, dielectrics, semiconductor, etc.) on substrates, there is a need to reliably and accurately control the temperature of the fixtures used to support the substrates during the deposition process. Typically, such fixtures must withstand the intense heat associated, for example, with the ion bombardment which characterizes the sputtering process, and some means must be provided for dissipating the thermal energy impacted to avoid damage to the substrate and its holder. In most deposition systems, the temperature control problem is complicated by the fact that the substrate receiving the thin-film must be continuously moved to achieve a film of uniform thickness and, perhaps, stoichiometry. Movement of the substrate is most often achieved by mounting the substrate on a rotatably-driven plate or turntable, and temperature control is achieved by circulating a liquid coolant (e.g. water or ethylene glycol). The liquid coolant enters and exits the substrate holder through the rotatably driven shaft which supports such holder. Elastomeric seals are used to contain the coolant where it enters and exits the shaft (external to the vacuum). Typically, these seals are prone to failure through wear and/or corrosion and have a limited useful life. Hence, it would be desirable to provide a mechanism for cooling a moving substrate holder in a thin-film deposition system which does not require the introduction of a liquid coolant through a rotatably driven drive shaft.

SUMMARY OF THE INVENTION

According to the present invention, the temperature of a moving, thermally-conductive substrate holder in a thin-film deposition system is controlled by thermally coupling such holder to a stationary, temperature-controlled member through a liquid heat transfer medium, preferably liquid gallium. According to a preferred embodiment, a circular channel formed in one surface of a substrate holder contains liquid gallium. At least a portion of the stationary temperature-controlled member is in the shape of a ring which, during rotational movement of the substrate holder, is immersed in the liquid heat transfer medium to dissipate (or add) heat from (or to) the substrate holder.

The invention will be better understood from the ensuing detailed description of a preferred embodiment, reference being made to the drawings.

DETAILED DESCRIPTION OF A PREFERRED EMBODIMENT

Figure 1:
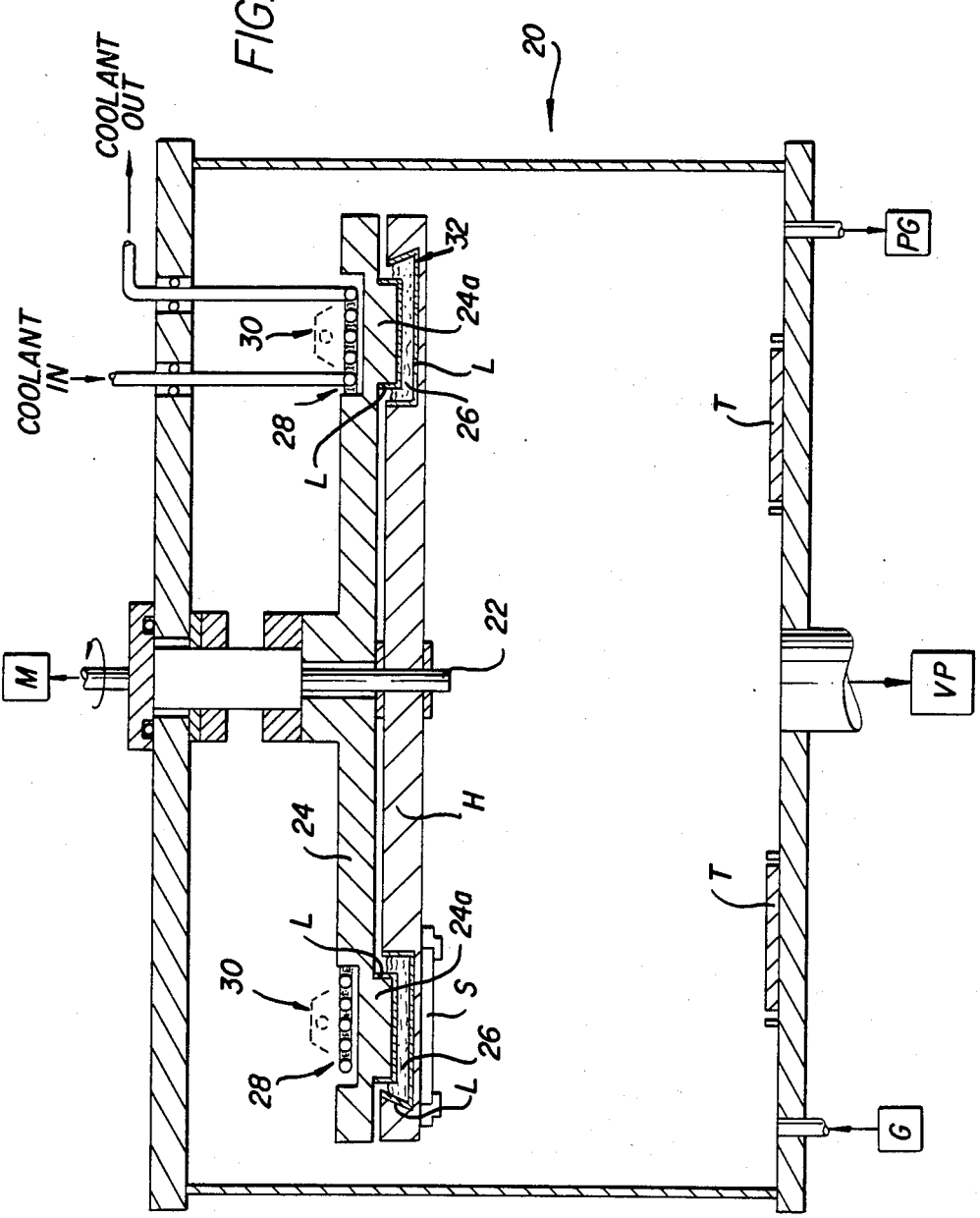
FIG. 1 is a front elevational sectional view of a thin-film deposition system embodying the temperature control apparatus of the invention.

Referring now to the drawings, a thin film deposition system, in particular a sputtering deposition system, is shown to comprise a vacuum chamber 20 which is connected to a vacuum pump VP for evacuating the chamber to a desired pressure. The chamber may be back-filled with desired gas, such as argon, to a desired pressure from a gas source G. A pressure gauge PG monitors the vacuum in chamber 20.

During the sputtering process, an applied electric field serves to ionize the gas in the vacuum chamber, causing the target material T to be bombarded with ions (e.g. argon ions). Sputtered material from the target deposits on a substrate S, thereby forming a thin-film of target material on the substrate. For several reasons, it is often desirable to continuously move the substrate within the vacuum chamber during the deposition process. Such substrate movement is often effected by mounting the substrate on a movable holder H which, most commonly, is mounted for rotation on a rotatably driven drive shaft 22 driven by motor M. Drive shaft S is supported for rotation in a conventional rotary feed-through device containing a ferrofluid or bellows-type vacuum seal.

During the thin-film deposition process, whether it be a sputtering or other technique, there is a need to control the temperature of the moving substrate holder H. According to the present invention, such temperature control is achieved by the provision of a temperature-controlled, thermally conductive member 24 and a liquid heat transfer medium 26. Member 24 is stationary within the vacuum chamber and its temperature may be controlled, for example, by circulating a liquid coolant (e.g. water or ethylene glycol) through a spirally wound conduit 28, and/or by heating such member with quartz lamps (or resistive heaters) 30. Thermal energy is exchanged between member 24 and substrate holder H by virtue of the thermal coupling provided by liquid medium 26. As shown in FIG. 1, medium 26 may be contained by a circular channel 32 formed in the upper surface of the substrate holder, and a ring-shaped extension 24a of member 24 extends downwardly into channel 32 and is immersed in the liquid medium. During rotational movement of holder H, the extension ring of member 24 remains immersed in medium 26 and which conducts thermal energy between holder H and member 24.

As regards materials, it is highly preferred that medium 26 comprise liquid gallium, or a lower melting point gallium eutectic, such as indium- or tin-doped gallium. Gallium, with a melting point of 29.8° C. and a vaporization temperature above 2200° C., has the longest liquid interval of all the elements. The vapor pressure of gallium is, therefore, of no concern for introducing gallium as a system contaminant at reasonable operating temperatures. At 482° C., for example, the vapor pressure of gallium is $10^{-11}$ Torr. Because the melting temperature of pure gallium is slightly above room temperature, tempered water is circulated in member 24 to prevent solidification. While indium/gallium (24/76%) and tin/gallium (8.5/91.5%) eutectics have lower melting temperatures (15.7 and 20.6, respectively) than pure gallium, their respective vaporization temperature is somewhat lower than pure gallium.

As regards the materials of member 24 and holder H, both preferably comprise stainless steel. Also, preferred is that, a liner (e.g., ceramic or refractory metal) L be provided on both members when liquid gallium is the heat transfer medium. Gallium diffuses into the crystal lattice of most metals, particularly aluminum causing them to become brittle. Thus, while member 24 and holder H may even be made of aluminum, a suitable liner should be used to guard against such diffusion. Such liners are needed particularly for high temperature operation because gallium, at temperatures between 500°–1000° C. is very corrosive to most metals. Only tunsten is unaltered by liquid gallium; niobium, tantalum, and molybdenum are somewhat less resistant.

Figure 2:
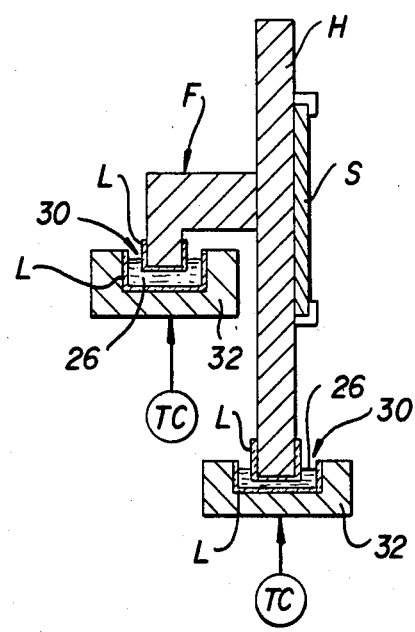
FIG. 2 is a sectional view illustrating an alternative embodiment of the invention.

Referring to FIG. 2, there is depicted an apparatus for controlling the temperature of a substrate holder H moving along a linear path defined by the linear chammels 30 formed in the temperature-controlled, heat conductive members 32. Temperature control means TC control the temperature of members 32, and a liquid heat transfer medium 26 is disposed in the channels to conduct thermal energy between holder H and member 32. Thus, the apparatus of FIG. 2 functions in substantially the same manner as that of the apparatus shown in FIG. 1.

The invention has been described in detail with particular reference to preferred embodiments thereof, but it will be understood that variations and modifications can be effected within the spirit and scope of the invention.

I claim:

1. A thin-film deposition system for depositing thin films of a material on a substrate, said system comprising:
   (a) a vacuum chamber;
   (b) a substrate holder for supporting a substrate adapted to receive a thin film of material;
   (c) means for advancing said substrate holder along a predetermined path within said vacuum chamber; and
   (d) means for controlling the temperature of said substrate holder while said holder is advanced along said path, said temperature controlling means comprising a stationary thermally conductive member positioned along said path, said member being spaced from said holder, means for controlling the temperature of said member, and liquid heat-transfer medium for thermally coupling said holder and said member while said holder advances along said path.

2. The apparatus as defined by claim 1 wherein said heat-transfer means medium comprises liquid gallium.

3. The apparatus as defined by claim 2 wherein said substrate holder defines a channel for containing said liquid gallium, and wherein said member is in thermal energy-conducting relationship with respect to said liquid gallium.

4. The apparatus as defined by claim 3 wherein said channel and said path are endless.

5. A thin-film deposition system for depositing thin films of material on a substrate, said system comprising:
   (a) a vacuum chamber;
   (b) a substrate holder for supporting a substrate adapted to receive a thin film of such material within said vacuum chamber;
   (c) means for controlling the temperature of said substrate holder while a thin film of material is deposited on a substrate supported by said holder, said temperature controlling means comprising a thermally conductive member, spaced from said substrate holder, means for controlling the temperature of said member, and a liquid heat-transfer medium for thermally coupling said substrate holder and said thermally conductive member; and
   (d) means for imparting relative movement between said substrate holder and said thermally conductive member.

6. The apparatus as defined by claim 5 wherein said heat-transfer medium comprises liquid gallium.

7. The apparatus as defined by claim 5 wherein said imparting means comprises means for moving said substrate holder relative to said thermally conductive member.

8. The apparatus as defined by claim 7 wherein said substrate holder defines a channel for containing a liquid, wherein said heat-transfer medium comprises liquid gallium, said liquid gallium being positioned in said channel, and wherein said thermally conductive member is in thermal contact with said liquid gallium.

9. The apparatus as defined by claim 8 wherein said channel is circular.

10. The apparatus as defined by claim 8 wherein said channel is linear.

* * * * *